United States Patent
Bissane et al.

(10) Patent No.: US 8,988,112 B2
(45) Date of Patent: Mar. 24, 2015

(54) LOW-VOLTAGE DIFFERENTIAL SIGNAL ACTIVITY DETECTOR

(75) Inventors: Fouad Bissane, Tullins (FR); Hugo Gicquel, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 300 days.

(21) Appl. No.: 13/616,640

(22) Filed: Sep. 14, 2012

(65) Prior Publication Data

US 2013/0069624 A1 Mar. 21, 2013

(30) Foreign Application Priority Data

Sep. 15, 2011 (FR) ...................... 11 58218

(51) Int. Cl.
*H03K 5/153* (2006.01)
*G01R 19/10* (2006.01)
*H03K 5/1534* (2006.01)

(52) U.S. Cl.
CPC ............. *G01R 19/10* (2013.01); *H03K 5/1534* (2013.01)
USPC .......................................... 327/58

(58) Field of Classification Search
CPC ..................... H03K 5/2409–5/2426
See application file for complete search history.

(56) References Cited

U.S. PATENT DOCUMENTS

| 6,781,965 B1 | 8/2004 | Berzins et al. |
| 7,199,621 B1 * | 4/2007 | Al-Shyoukh et al. ........... 327/65 |
| 2006/0164125 A1 | 7/2006 | Mulder |

FOREIGN PATENT DOCUMENTS

WO 2009117394 9/2009

* cited by examiner

*Primary Examiner* — Sibin Chen
(74) *Attorney, Agent, or Firm* — Allen, Dyer, Doppelt, Milbrath & Gilchrist, P.A.

(57) ABSTRACT

An activity detector for a differential signal formed by two components may include a current source connected to a power supply line, and a first transistor has a drain being powered by the current source, and has a source that forms a first input terminal receiving a first component of the differential signal. A second transistor has a drain being powered by the current source, and has a source forms a second input terminal receiving the second component of the differential signal. A bias circuit applies a potential to the gates of the first and second transistors, establishing a balance condition where all the current from the current source is distributed between the two transistors when the first and second input terminal potential is equal to a threshold value. An activity indication terminal is taken from the drains of the first and second transistors.

12 Claims, 1 Drawing Sheet

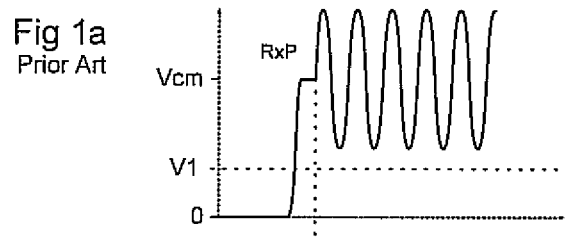
Fig 1a
Prior Art
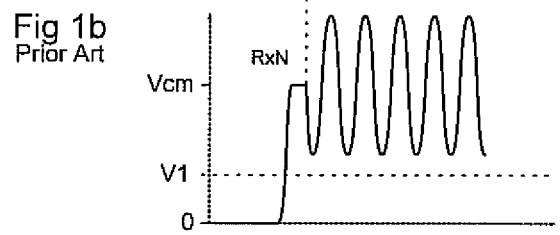
Fig 1b
Prior Art
Fig 2
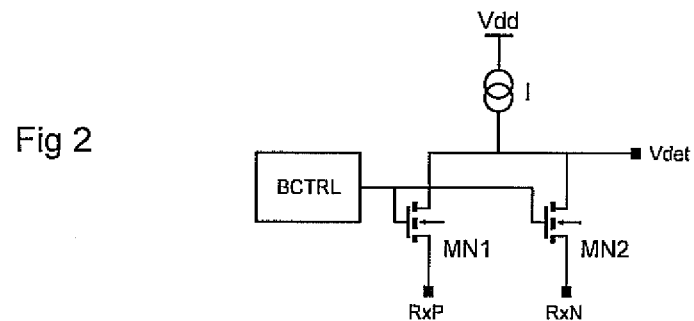
Fig 3
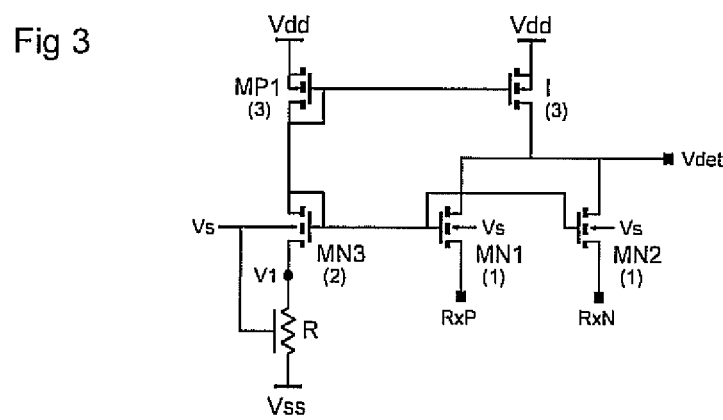

LOW-VOLTAGE DIFFERENTIAL SIGNAL ACTIVITY DETECTOR

FIELD OF THE INVENTION

The invention relates to a differential signal activity detector, in particular within the frame of communication interfaces according to Mobile Industry Processor Interface (MIPI) standards.

BACKGROUND OF THE INVENTION

The standard [MIPI M-PHYSM Version 1.00.00—Aug. 2, 2011] characterizes a rapid communication interface between integrated circuits, in particular, between an analog integrated circuit of a radio receiver and a digital integrated circuit intended to perform the required processes on the received signal. The signals are transmitted between circuits in a low voltage differential form, called LVDS (Low Voltage Differential Signal).

FIGS. 1a and 1b show a typical startup of a transmission according to the MIPI M-PHYSM standard, and more particularly, an exemplary waveform of the two components R×P and R×N of the LVDS signal, respectively are shown. In the absence of activity, corresponding to the initial part of the waveform, the components R×P and R×N are both at zero. At the beginning of an activity, both components are brought to a same common mode level Vcm, typically around 200 mV. The components R×P and R×N then evolve in phase opposition, symmetrically with respect to the common mode Vcm, typically between 100 and 300 mV.

A transmission between an emitter circuit and a receiver circuit is generally discontinuous. Thus, to save energy, it may be desirable to activate the reception circuits only when the received signal has an activity. Indeed, a reception circuit consumes current even when the input signal is inactive. This consumption increases with the nominal frequency of the input signal.

There is therefore a need to detect an activity of an LVDS signal of the type of FIGS. 1a and 1b. Then, for example, the reception circuit may be powered up only during the phases where the signal has an activity.

Patent application WO2009117394 describes an approach to detecting the activity of an LVDS signal, independently of the common modes of the two signal components. The circuit described is particularly complex, in particular, if the activity indication signal should be delivered as a DC voltage. In addition, the current consumption of the circuit is high given the number of branches between the power supplies lines.

SUMMARY OF THE INVENTION

An activity detector of LVDS signals having a simple structure may therefore be desirable. The detector may be, for example, adapted to LVDS signals used within the frame of MIPI standards.

This desire is addressed by an activity detector for a differential signal having two components. The activity detector includes a first current source connected to a power supply line, a first transistor whose drain is supplied by the current source and whose source forms a first input terminal receiving a first component of the differential signal, and a second transistor whose drain is supplied by the current source and whose source forms a second input terminal receiving the second component of the differential signal. A bias circuit is configured to apply a constant voltage to the gates of the first and second transistors to establish a balance condition where all the current from the current source is distributed between the two transistors when the voltage of the first and second terminals is equal to a threshold value. An activity indication terminal is taken from the drains of the first and second transistors.

According to an embodiment, the bias circuit comprises a first current mirror including a first diode connected to the power supply line and an output transistor configured to mirror the current of the first diode on its drain. The output transistor forms the first current source. The bias circuit also includes a second diode connected in series with the first diode. The gates of the first and second transistors are connected to the connection node between the first and second diodes. A second current source is connected between the second diode and a power supply reference voltage line. The threshold value being established on the connection node between the second current source and the second diode. The first and second transistors form, with the second diode, respective second and third current mirrors when the source voltage of the first and second transistors is equal to the threshold value. The diodes and transistors are sized so that the sum of the mirror factors of the second and third current mirrors is equal to the mirror factor of the first current mirror.

According to an embodiment, when the differential signal is inactive, the two components are both nominally at the power supply reference voltage. When the differential signal is active, the two components nominally vary in phase opposition around a same common mode voltage offset toward the power supply voltage so that the component variations do not reach the power supply reference voltage. The bias circuit is sized so that the threshold value is established between the power supply reference voltage and the minimum nominal value of the components of the active differential signal.

According to an embodiment, the diodes are formed by transistors of the same nature or type as the output transistors of the corresponding mirrors. The substrate voltage of the transistor forming the second diode and the first and second transistors are adjustable to set the threshold value.

BRIEF DESCRIPTION OF THE DRAWINGS

FIGS. 1a and 1b are exemplary waveforms at the beginning of activity of the components of an LVDS signal according to the MIPI M-PHYSM standard.

FIG. 2 is a schematic diagram of an embodiment of an LVDS signal activity detector in accordance with the present invention.

FIG. 3 is a schematic diagram of the bias circuit of the activity detector of FIG. 2.

DETAILED DESCRIPTION OF THE PREFERRED EMBODIMENTS

FIGS. 1a and 1b show a threshold V1 between zero and the minimum nominal value of the components R×P and R×N of an LVDS signal during activity. To detect the signal activity, it would suffice to detect that the two components R×P and R×N are above this threshold. It is desirable to detect the components relatively simply.

In addition, within the frame of the MIPI M-PHYSM standard, some difficulties are encountered. According to the nominal conditions specified by the MIPI M-PHYSM standard, a margin of 100 mV is provided between the minimum value of the components R×P and R×N during activity, and the power supply voltage reference (0V). However, the reference of the emission circuit, which determines the zero of the LVDS signal, is not the same as that of the reception circuit. A difference of around 50 mV is tolerated. In addition, the peak-to-peak amplitude of the LVDS signal components is defined with a margin around the nominal value, so that in some situations, the components R×P and R×N have deviations below the zero of the reception circuit. It is desirable that the activity detector is not affected by these operating conditions.

FIG. 2 schematically shows an embodiment of an LVDS signal activity detector for detecting signals of the type of FIGS. 1a and 1b. The LVDS signal activity detector has a relatively simple structure while being robust to extreme operating conditions.

The LVDS signal components R×P and R×N are applied to the respective sources of two N-channel MOS transistors MN1 and MN2. The drains of transistors MN1 and MN2 are connected to a power supply line Vdd by a constant current source I common to both transistors. The output Vdet of the detection circuit is taken from the drains of transistors MN1 and MN2. The gates of transistors MN1 and MN2 receive a same voltage level established by a bias circuit BCTRL.

The bias circuit BCTRL is configured, given the characteristics of transistors MN1 and MN2 and the current source I, to establish a bias level such that transistors MN1 and MN2 absorb all the current of the source I when the two components R×P and R×N are at the desired threshold level V1. The threshold is, for example, located as shown in FIGS. 1a and 1b, between the power supply zero of the reception circuit and the minimum nominal value of the components R×P and R×N of the active LVDS signal. It is preferably higher than the offset (50 mV) between the zeros of the reception circuit and the emission circuit.

With this configuration, as long as the two components R×P and R×N are below the threshold V1, which is the case when the LVDS signal is inactive, transistors MN1 and MN2 derive all the current produced by the source I and pull the terminal Vdet toward zero. A value near zero of signal Vdet thus indicates a lack of activity on the input signal.

In the nominal conditions shown in FIGS. 1a and 1b, when the input signal has activity, both components R×P and R×N are above the threshold V1. Transistors MN1 and MN2 are both blocked and the source I pulls the output Vdet toward the power supply voltage Vdd. A value near Vdd of the signal Vdet thus indicates activity on the input signal.

In exceptional conditions during activity of the input signal, the components R×P and R×N may have deviations below the threshold V1, but, as these components are in phase opposition, only one at a time goes below threshold V1. The result is that one of the transistors MN1 and MN2 becomes conductive. Given the sizes of the transistors and their gate bias, the fact that a single transistor is conductive is not enough to derive all the current of the source I. The result is that the source I "wins" and maintains the output Vdet near Vdd. The deviation of the component needs to be significantly lower than the threshold V1 for the transistor to derive all the current of the source I. This condition would be very exceptional and too brief anyway, given the reaction time of the circuit, for the transistor to have enough time to pull the output Vdet low enough to cause false inactivity detection.

In exceptional conditions during inactivity of the input signal, one of the components could exceed the threshold V1 at an untimely moment. The corresponding transistor would turn off. Nevertheless, the source of the other transistor is nearly at zero, i.e. clearly below the threshold V1. The transistor may be conductive enough to derive, alone, all the current of the source I. If this is not the case, the current source I "wins" and pulls the output Vdet toward voltage Vdd at an untimely moment, causing false activity detection.

It is nevertheless to be noted that the only consequence of a false activity detection is a brief powering up of the reception circuit (if the detector is used to that end), which may not be a serious issue. However, false inactivity detection may cause a loss of data and, as previously mentioned, the structure is particularly robust to false inactivity detections.

Ideally, the threshold V1 is chosen low enough to avoid a single transistor from deriving all the current I when its source goes under the threshold V1 at an untimely moment, and high enough for the transistor which remains conductive, when one of the components goes above the threshold V1 at an untimely moment, to derive all the current I. If both contradictory conditions cannot be satisfied, it is preferable to satisfy the first, which avoids the risk of false inactivity detections.

FIG. 3 schematically shows a preferred embodiment of the bias circuit BCTRL and the current source I. This structure allows the bias of the gates of transistors MN1 and MN2 to self-adapt as a function of the desired threshold V1 and the current of source I.

The current source I is formed by a P-channel metal oxide semiconductor (MOS) transistor whose source is connected to line Vdd and whose drain is connected to output Vdet. Transistor I is connected in a current mirror configuration with a P-channel MOS transistor MP1 connected in a diode configuration. The source of transistor MP1, forming the diode's anode, is connected to line Vdd. The drain and gate of transistor MP1 together form the diode's cathode. An N-channel MOS transistor MN3 is connected in a diode configuration. The drain and gate of transistor MN3 together form the diode's anode, which is connected to the cathode of diode MP1. The cathode of diode MN3 is connected to the power supply reference line Vss by a current source, preferably in the form of a resistor R. The connection node between both diodes MP1 and MN3 is connected to the gates of transistors MN1 and MN2.

With this configuration, each transistor MN1 and MN2 is connected in a current mirror configuration with the diode MN3 at the time when the source voltage of the transistor is equal to the cathode voltage of diode MN3. This stable cathode voltage is the desired threshold level V1. In these conditions, the transistor MN1 or MN2 mirrors, in its drain, the current flowing through diode MN3, with a multiplicative factor equal to the transistor size ratio.

FIG. 3 indicates, between parentheses, an example of normalized sizes for the transistors. The P-channel transistors MP1 and I have a size 3, meaning that transistor I mirrors the current of transistor MP1 with a multiplicative factor of 1. Transistor MN3 has a size 2 and transistors MN1 and MN2 have a size 1, meaning that transistors MN1 and MN2 mirror the current of transistor MN3, which is the same current as that of transistor MP1, with a factor ½. Thus, when the sources of both transistors MN1 and MN2 are at level V1, the circuit is in a balance state where the current that transistor I tends to supply is equally distributed between transistors MN1 and MN2. The output Vdet is then in an uncertain state.

When the source voltage of one of transistors MN1 and MN2 is offset from level V1, the balance state is upset and the output Vdet is pulled, according to the offset direction, toward Vdd or the source at the lowest voltage among the transistors MN1 and MN2.

The threshold level V1 is established at Vdd-Vt1-Vt3, where Vt1 and Vt3 are the threshold voltages of diodes MP1 and MN3, which increase with the current in these diodes. The current of the diodes, therefore affecting level V1, can be adjusted using resistor R.

To offer more flexibility for setting level V1, the substrate voltage Vs of transistor MN3 may be adjusted. Indeed, the gate-source threshold voltage of a transistor (and therefore the diode threshold voltage) varies with the gate-substrate voltage. To keep transistor MN3 matched with transistors MN1 and MN2, the substrates of transistors MN1 and MN2 also receive voltage Vs. If this were not enough, the substrate voltage of transistors MP1 and I may also be adjusted.

As an example, for a 65 nm technological node under a voltage Vdd=1.2V, the characteristics of the elements may be as follows:

MP1 and I: 3 elementary two-finger transistors with L=1 and W=2 (units expressed in multiples of the technological node size), MN1 and MN2: 1 one-finger elementary transistor with L=1 and W=0.4, MN3: 2 one-finger elementary transistors with L=1 and W=0.5, Vs (SUB_RX)=0, R=9.35 kOhm.

With these values, a 4 µA current is established in each branch of the circuit. The threshold level V1 is then 43 mV. It is to be noted that the channel width W of transistor MN3 is slightly larger than that of transistors MN1 and MN2. It allows a determined level of the output Vdet to be established in the balance situation. Indeed, transistors MN1 and MN2 are then not conductive enough to absorb all the current supplied by the transistor I. The result is that the transistor I wins and pulls the output Vdet toward Vdd.

Many variations and modifications of the embodiments described here will clearly appear to those skilled in the art. Although the transistors MN1 and MN2 have been described as having the same size, their sizes may differ provided that the sum of the factors of the mirrors including transistors MN1 and MN2 is equal to the factor of the mirror formed by transistors MP1 and I. This allows processing of differential signal components having distinct gains.

That which is claimed is:

1. An activity detector for a differential signal having first and second components, the activity detector comprising:
   a current source comprising an output transistor having a drain and configured to be coupled to a power supply line;
   a first transistor having a drain coupled to said current source, a source defining a first input terminal configured to receive the first component of the differential signal, and a gate;
   a second transistor having a drain coupled to said current source, a source defining a second input terminal configured to receive the second component of the differential signal, and a gate;
   a bias circuit configured to apply a voltage to the gates of said first and second transistors to establish a balance condition wherein current from said current source is distributed between said first and second transistors when a voltage of the first and second input terminals is equal to a threshold value, said bias circuit comprising
      a first diode coupled to the power supply line and said output transistor to define a first current mirror configured to mirror current of the first diode on the drain of said output transistor,
      a second diode coupled in series with said first diode, the gates of said first and second transistors being coupled between said first and second diodes, and
      a further current source coupled between said second diode and configured to be coupled to a power supply reference voltage line, the threshold value being established between said further current source and said second diode,
   said first and second transistors defining with said second diode respective second and third current mirrors when a source voltage of said first and second transistors is equal to the threshold value, said first and second diodes and said first and second transistors being sized so that a sum of mirror factors of the second and third current mirrors is equal to a mirror factor of the first current mirror; and
   an activity indication terminal coupled to the drains of said first and second transistors.

2. The detector of claim 1, wherein said bias circuit is configured to apply a constant voltage to the gates of said first and second transistors.

3. The detector of claim 1, wherein said first and second diodes comprise transistors of a same type.

4. The detector of claim 3, wherein a substrate voltage of said second diode and said first and second transistors is adjustable to set the threshold value.

5. The detector of claim 1, wherein the first and second components are both nominally at a power supply reference voltage when the differential signal is inactive, and wherein the first and second components nominally vary in phase opposition around a same common mode voltage offset toward a voltage of the power supply line so that first and second component variations do not reach the power supply reference voltage when the differential signal is active.

6. The detector of claim 5, wherein said bias circuit is sized so that the threshold value is between the power supply reference voltage and a minimum nominal value of the first and second components of the active differential signal.

7. An activity detector for a differential signal having first and second components, the activity detector comprising:
   a current source comprising an output transistor having a drain;
   a first transistor having a drain coupled to said current source, a source defining a first input terminal configured to receive the first component of the differential signal, and a gate;
   a second transistor having a drain coupled to the current source, a source defining a second input terminal configured to receive the second component of the differential signal, and a gate;
   a bias circuit configured to apply a voltage to the gates of said first and second transistors to establish a balance condition, said bias circuit comprising
      a first diode coupled to said output transistor to define a first current mirror configured to mirror current of the first diode on the drain of said output transistor;
      a second diode coupled in series with said first diode,
      the gates of said first and second transistors being coupled between said first and second diodes, and
      a further current source coupled between said second diode,
   said first and second transistors defining with said second diode respective second and third current mirrors when a source voltage of said first and second transistors is equal to a threshold value, said first and second diodes and said first and second transistors being sized so that a sum of mirror factors of the second and third current mirrors is equal to a mirror factor of the first current mirror; and
   an activity indication terminal coupled to the drains of said first and second transistors.

8. The detector of claim 7, wherein said first and second diodes comprise transistors of a same type.

9. The detector of claim 7, wherein the first and second components are both nominally at a power supply reference voltage when the differential signal is inactive, and wherein the first and second components nominally vary in phase opposition around a same common mode voltage offset toward a voltage of a power supply line so that first and second component variations do not reach a power supply reference voltage when the differential signal is active.

10. A method of detecting activity for a differential signal comprising:
   receiving a first component of the differential signal at a source of a first transistor defining a first input terminal, the first transistor having a drain to be coupled to a current source comprising an output transistor having a drain;
   receiving a second component of the differential signal at a source of a second transistor, the second transistor having a drain to be coupled to the current source;
   biasing the first and second transistors by applying a voltage to gates of the first and second transistors to establish a balance condition wherein current from the current source is distributed between the first and second transistors when a voltage of the first and second input terminals is equal to a threshold value, wherein biasing the first and second transistors comprises
      mirroring current of a first diode on the drain of the output transistor,
      establishing the threshold value between a further current source and a second diode coupled in series with the first diode,
      the gates of the first and second transistors being coupled between the first and second diodes, and
      mirroring current via the first and second transistors and the second diode when a source voltage of the first and second transistors is equal to the threshold value, the first and second diodes and the first and second transistors being sized so that a sum of mirror factors of the second and third current mirrors is equal to a mirror factor of the first current mirror; and
   detecting activity from an activity indication terminal coupled to the drains of the first and second transistors.

11. The method of claim 10, wherein the first and second components are both nominally at a power supply reference voltage when the differential signal is inactive, and wherein the first and second components nominally vary in phase opposition around a same common mode voltage offset toward a power supply line voltage so that first and second component variations do not reach the power supply reference voltage when the differential signal is active.

12. The method of claim 11, wherein the bias circuit is sized so that the threshold value is between the power supply reference voltage and a minimum nominal value of the first and second components of the active differential signal.

* * * * *